United States Patent
Kimura et al.

(10) Patent No.: US 10,707,339 B2
(45) Date of Patent: *Jul. 7, 2020

(54) SEMICONDUCTOR DEVICE

(71) Applicant: Kabushiki Kaisha Toshiba, Minato-ku (JP)

(72) Inventors: Shigeya Kimura, Yokohama (JP); Hisashi Yoshida, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/297,787

(22) Filed: Mar. 11, 2019

(65) Prior Publication Data

US 2019/0348531 A1    Nov. 14, 2019

(30) Foreign Application Priority Data

May 14, 2018   (JP) .................. 2018-092991

(51) Int. Cl.
*H01L 31/0256*   (2006.01)
*H01L 29/778*   (2006.01)
(Continued)

(52) U.S. Cl.
CPC ...... *H01L 29/7783* (2013.01); *H01L 29/1608* (2013.01); *H01L 29/2003* (2013.01);
(Continued)

(58) Field of Classification Search
CPC ............. H01L 29/7783; H01L 29/1608; H01L 29/2003; H01L 29/267
(Continued)

(56) References Cited

U.S. PATENT DOCUMENTS

2006/0280668 A1   12/2006  Dmitriev et al.
2017/0200806 A1    7/2017  Ichimura et al.
(Continued)

FOREIGN PATENT DOCUMENTS

JP    2005-225756    8/2005
JP    5207874        6/2013
(Continued)

OTHER PUBLICATIONS

Shen, Z., et al., "Prediction of High-Density and High-Mobility Two-Dimensional Electron Gas at $Al_xGa_{1-x}N/4H$—SiC Interface", Materials Science Forum, vol. 897, Sep. 10, 2016, pp. 719-722.
(Continued)

*Primary Examiner* — David S Blum
(74) *Attorney, Agent, or Firm* — Oblon, McClelland, Maier & Neustadt, L.L.P.

(57) ABSTRACT

According to one embodiment, a semiconductor device includes first to third regions, and first to third electrodes. The first region includes a first partial region, a second partial region, and a third partial region between the first and second partial regions. A direction from the first partial region toward the first electrode is aligned with a first direction. A direction from the second partial region toward the second electrode is aligned with the first direction. A second direction from the first electrode toward the second electrode crosses the first direction. A direction from the third partial region toward the third electrode is aligned with the first direction. At least a portion of the third region is provided between the first and second electrodes in the second direction. At least a portion of the second region is provided between the third and first regions.

20 Claims, 12 Drawing Sheets

(51) Int. Cl.
  *H01L 29/20* (2006.01)
  *H01L 29/267* (2006.01)
  *H01L 29/16* (2006.01)
  H01L 29/423 (2006.01)
  H01L 29/205 (2006.01)

(52) U.S. Cl.
  CPC .......... *H01L 29/267* (2013.01); *H01L 29/205* (2013.01); *H01L 29/4236* (2013.01)

(58) Field of Classification Search
  USPC .......................................................... 257/76
  See application file for complete search history.

(56) References Cited

U.S. PATENT DOCUMENTS

| | | | |
|---|---|---|---|
| 2019/0032856 A1* | 1/2019 | Lim | F21V 29/70 |
| 2019/0348503 A1* | 11/2019 | Kimura | H01L 29/66462 |
| 2019/0385846 A1* | 12/2019 | Fukuhara | H01L 29/812 |
| 2020/0027978 A1* | 1/2020 | Kajiwara | H01L 29/205 |

FOREIGN PATENT DOCUMENTS

| | | |
|---|---|---|
| JP | 5733258 | 6/2015 |
| JP | WO2016/051935 A1 | 4/2016 |

OTHER PUBLICATIONS

Onojima, N. et al. "Molecular-beam epitaxy of AlN on off-oriented SiC and demonstration of MISFET using AlN/SiC interface", Phys.stat.sol. No. 7, 2005, 4 pages.

\* cited by examiner

SEMICONDUCTOR DEVICE

CROSS-REFERENCE TO RELATED APPLICATIONS

This application is based upon and claims the benefit of priority from Japanese Patent Application No. 2018-092991, filed on May 14, 2018; the entire contents of which are incorporated herein by reference.

FIELD

Embodiments described herein relate generally to a semiconductor device.

BACKGROUND

For example, there is a semiconductor device such as a HEMT or the like including a GaN layer and an AlGaN layer. It is desirable to improve the characteristics of the semiconductor device.

DETAILED DESCRIPTION

Figure 1:
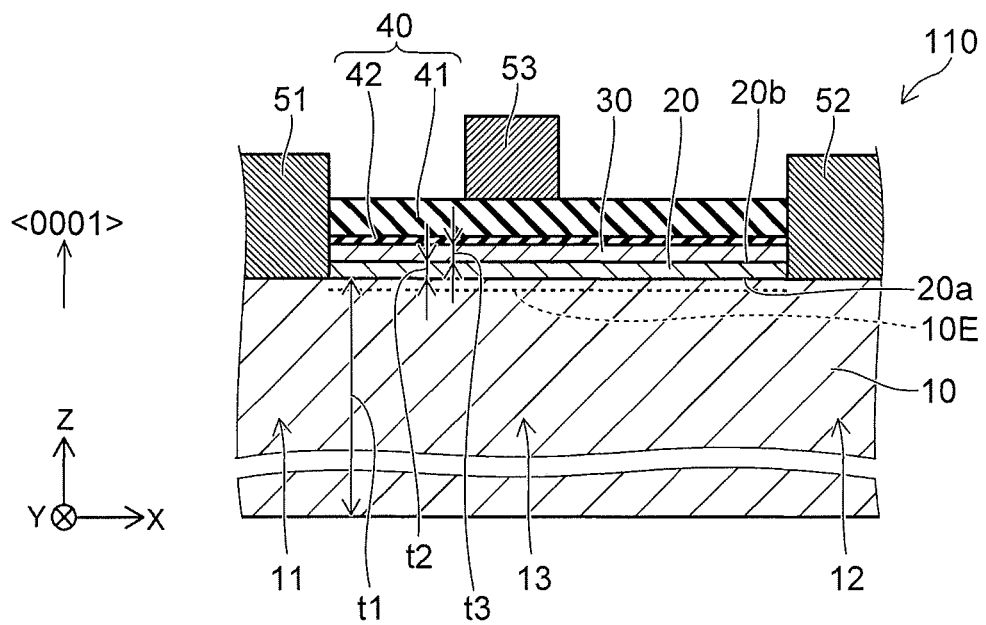
FIG. 1 is a schematic cross-sectional view illustrating a semiconductor device according to a first embodiment.

According to one embodiment, a semiconductor device includes first to third regions, and first to third electrodes. The first region includes SiC and includes a first partial region, a second partial region, and a third partial region between the first partial region and the second partial region. A direction from the first partial region toward the first electrode is aligned with a first direction. A direction from the second partial region toward the second electrode is aligned with the first direction. A second direction from the first electrode toward the second electrode crosses the first direction. A direction from the third partial region toward the third electrode is aligned with the first direction. A position of the third electrode in the second direction is between a position of the first electrode in the second direction and a position of the second electrode in the second direction. The second region includes $Al_{x2}Ga_{1-x2}N$ ($0.2 \le x2 < 1$). The third region includes $Al_{x3}Ga_{1-x3}N$ ($x2 < x3 \le 1$). At least a portion of the third region is provided between the first electrode and the second electrode in the second direction. At least a portion of the second region is provided between the third region and the first region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the first embodiment includes a first region 10, a second region 20, a third region 30, and first to third electrodes 51 to 53. An insulating portion 40 is further provided in the example.

The first region 10 includes SiC. The SiC is, for example, 6H—SiC or 4H—SiC.

The first region 10 includes first to third partial regions 11 to 13. The third partial region 13 is between the first partial region 11 and the second partial region 12.

The direction from the first partial region 11 toward the first electrode 51 is aligned with a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the second partial region 12 toward the second electrode 52 is aligned with the first direction (the Z-axis direction). A second direction from the first electrode 51 toward the second electrode 52 crosses the first direction. The second direction is, for example, the X-axis direction.

The direction from the third partial region 13 toward the third electrode 53 is aligned with the first direction (the Z-axis direction). A position of the third electrode 53 in the second direction (in the example, the X-axis direction) is between the position of the first electrode 51 in the second direction and the position of the second electrode 52 in the second direction.

The second region 20 includes $Al_{x2}Ga_{1-x2}N$ ($0.2 \le x2 \le 1$). In the example, at least a portion of the second region 20 is provided between the first region 10 and at least a portion of the third electrode 53 in the first direction (the Z-axis direction). For example, at least a portion of the second region 20 contacts the first region 10. For example, at least a portion of the second region 20 may be epitaxially-grown on the first region 10.

The third region 30 includes $Al_{x3}Ga_{1-x3}N$ (x2<x3≤1). The composition ratio of Al in the third region 30 is higher than the composition ratio of Al in the second region 20. At least a portion of the third region 30 is provided between the first electrode 51 and the second electrode 52 in the second direction (e.g., the X-axis direction). At least a portion of the second region 20 is provided between the third region 30 and the first region 10 in the first direction (the Z-axis direction). In the example, at least a portion of the third region 30 is provided between the third electrode 53 and the second region 20 in the first direction (the Z-axis direction). For example, the third region 30 may be epitaxially-grown on the second region 20.

At least a portion of the second region 20 is provided between the insulating portion 40 and the first region 10 in the first direction (the Z-axis direction). At least a portion of the third region 30 is provided between the third electrode 53 and the second region 20 in the first direction (the Z-axis direction). In the example, at least a portion of the insulating portion 40 is provided between the third electrode 53 and the second region 20 in the first direction (the Z-axis direction).

In the example, the insulating portion 40 includes a first insulating layer 41 and a second insulating layer 42. The second insulating layer 42 is provided between the first insulating layer 41 and the third region 30 in the first direction (the Z-axis direction). The first insulating layer 41 includes oxygen. The second insulating layer 42 includes nitrogen. The second insulating layer 42 does not include oxygen. Or, the concentration of oxygen in the second insulating layer 42 is lower than the concentration of oxygen in the first insulating layer 41. For example, the first insulating layer 41 includes silicon oxide. The second insulating layer 42 includes, for example, silicon nitride or silicon oxynitride. For example, the stability of the third region 30 (e.g., AlN) is increased by providing the second insulating layer 42 including nitrogen between the third region 30 and the first insulating layer 41 including oxygen. More stable characteristics are obtained easily.

In the embodiment, a thickness t3 along the first direction (the Z-axis direction) of the third region 30 (referring to FIG. 1) is thinner than a thickness t1 along the first direction of the first region 10 (referring to FIG. 1). For example, the thickness t1 of the first region 10 is 100 nm or more. The thickness t3 of the third region 30 is not less than 3 nm and not more than 500 nm.

The thickness of at least a portion of the second region 20 is taken as a thickness t2. The thickness t2 is the thickness (the length) along the first direction (the Z-axis direction). In one example, the thickness t2 is 2 nm or more. The at least a portion of the second region 20 recited above has a first surface 20a and a second surface 20b (referring to FIG. 1). The first surface 20a and the second surface 20b are along the second direction (e.g., the X-axis direction). For example, these surfaces are along the X-Y plane. The first surface 20a is the surface on the first region 10 side. The first surface 20a opposes the first region 10. The second surface 20b opposes the third region 30. The distance along the first direction (the Z-axis direction) between the first surface 20a and the second surface 20b corresponds to the thickness t2.

For example, the first electrode 51 is electrically connected to the first partial region 11 of the first region 10. For example, the first electrode 51 may be electrically connected to the interface between the first partial region 11 and the second region 20.

For example, the second electrode 52 is electrically connected to the second partial region 12 of the first region 10. For example, the second electrode 52 may be electrically connected to the interface between the second partial region 12 and the second region 20.

For example, the first electrode 51 functions as a source electrode. For example, the second electrode 52 functions as a drain electrode. For example, the third electrode 53 functions as a gate electrode. As described below, a carrier region is formed in a portion of the first region 10 on the second region 20 side. The carrier region includes, for example, a two-dimensional electron gas 10E. The semiconductor device 110 is, for example, a HEMT (High Electron Mobility Transistor). In other embodiments as described below, the carrier region may include a two-dimensional hole gas.

As described above, the second region 20 includes $Al_{x2}Ga_{1-x2}N$ (0.2≤x2≤1). The second region 20 has a polarity orientation. In the example shown in FIG. 1, the <0001> direction crosses the X-Y plane. In the example, the <0001> direction has a component in the direction from the first region 10 toward the second region 20. In another embodiment, the <000-1> direction may have a component in the direction from the first region 10 toward the second region 20.

The case will now be described where the <0001> direction of the second region 20 is aligned with the orientation from the first region 10 toward the second region 20. Hereinbelow, the orientation from the first region 10 toward the second region 20 is taken as the +Z orientation; and the orientation from the second region 20 toward the first region 10 is taken as the −Z orientation.

An example of simulation results of characteristics of the semiconductor device 110 will now be described.

Figure 2:
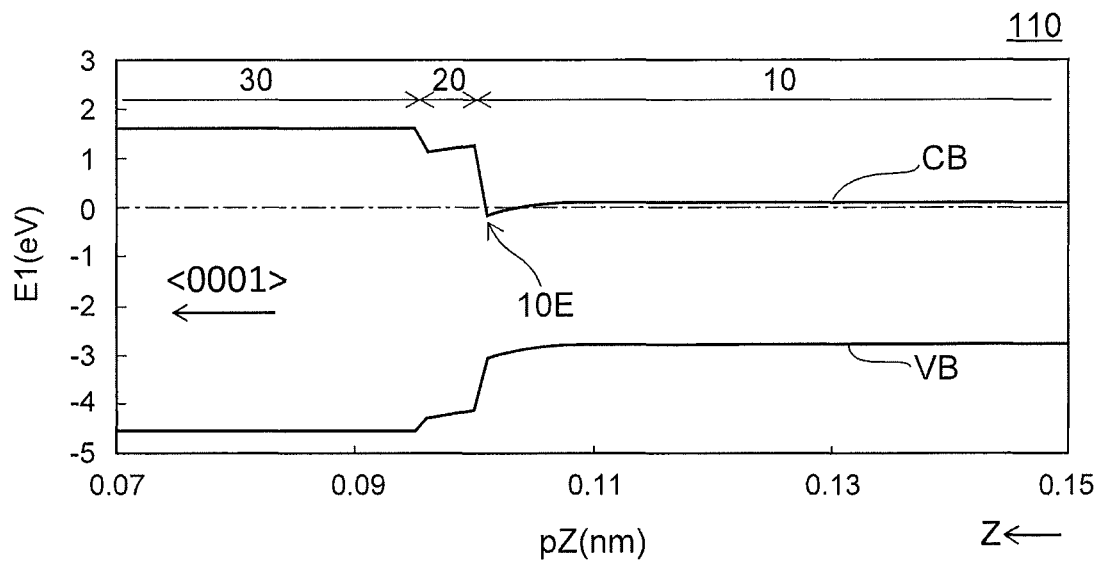
FIG. 2 is a schematic view illustrating the characteristics of the semiconductor device according to the first embodiment.

FIG. 2 is a schematic view illustrating the characteristics of the semiconductor device according to the first embodiment.

FIG. 2 illustrates simulation results of the characteristics of the semiconductor device 110. In FIG. 2, the horizontal axis is a position pZ (nm) along the Z-axis direction. The vertical axis is an energy E1 (eV). The energies of a conduction band CB and a valence band VB are shown in FIG. 2. The first region 10 is a 6H—SiC substrate in the example. The second region 20 is $Al_{0.8}Ga_{0.2}N$; and the thickness t2 of the second region 20 is 5 nm. The third region 30 is AlN; and the thickness t3 of the third region 30 is 25 nm.

As shown in FIG. 2, a local bottom is observed in the conduction band CB at the vicinity of the interface between the first region 10 and the second region 20. The local bottom corresponds to the carrier region (e.g., the two-dimensional electron gas 10E).

A SiC layer (the first region 10) and an AlGaN layer (or an AlN layer) (the second region 20 and the third region 30) are included in the embodiment. On the other hand, there is a first reference example in which a GaN layer is used as the first region 10, and an AlGaN layer is used as the second region 20 and the third region 30. The heat dissipation of SiC is higher than the heat dissipation of GaN. Therefore, the heat dissipation of the embodiment is higher than the heat dissipation of the first reference example.

For example, the breakdown voltage of the AlGaN layer (or the AlN layer) is higher than the breakdown voltage of GaN. For example, a higher breakdown voltage is obtained for the embodiment than for the first reference example.

In the embodiment, the second region 20 which has a lower Al composition ratio than the third region 30 is provided between the first region 10 (SiC) and the third region 30. On the other hand, a second reference example may be considered in which an AlGaN region having a higher Al composition ratio than the third region 30 is provided between the first region 10 (SiC) and the third region 30. As described below, compared to the second reference example, a higher carrier density is obtained for the configuration according to the embodiment.

To simplify the description hereinbelow, the case will be described where the lattice length of the crystal is the unstrained lattice length (lattice constant) (the perfect relaxation state) for each of the first region 10, the second region 20, and the third region 30. In the following example, the first region 10 is taken to be 6H—SiC; and the third region 30 is taken to be AlN.

FIG. 3A to FIG. 3D are schematic views illustrating the semiconductor device.

Figure 3A:
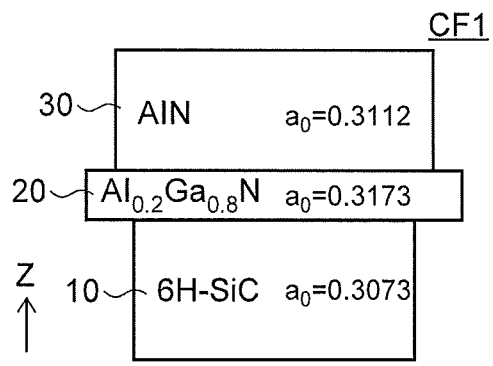
FIG. 3A to FIG. 3D are schematic views illustrating the semiconductor device.
Figure 3B:
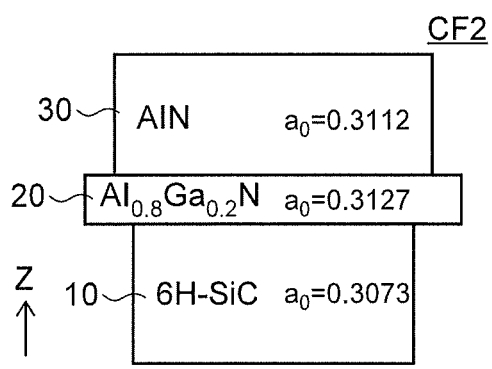
Figure 3C:
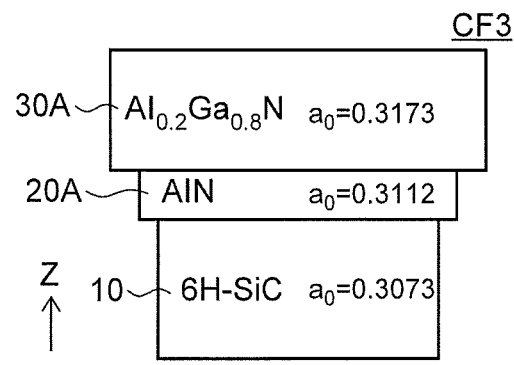
Figure 3D:
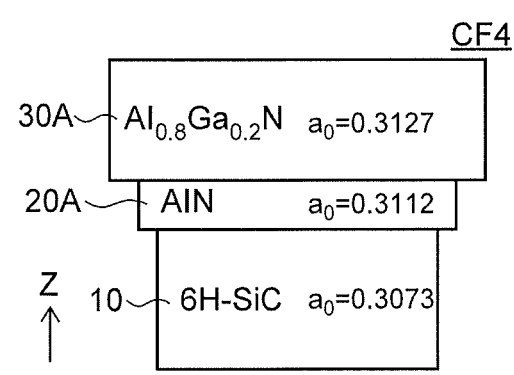

In a first configuration CF1 illustrated in FIG. 3A, the second region 20 of $Al_{0.2}Ga_{0.8}N$ is provided between the first region 10 (SiC) and the third region 30 (AlN). In a second configuration CF2 illustrated in FIG. 3B, the second region 20 of $Al_{0.8}Ga_{0.2}N$ is provided between the first region 10 (SiC) and the third region 30 (AlN). In a third configuration CF3 illustrated in FIG. 3C, a region 20A of AlN is provided between the first region 10 (SiC) and a region 30A ($Al_{0.2}Ga_{0.8}N$). In a fourth configuration CF4 illustrated in FIG. 3D, the region 20A of AlN is provided between the first region 10 (SiC) and the region 30A ($Al_{0.8}Ga_{0.2}N$). The thicknesses of the second region 20 and the region 20A are 5 nm. The thicknesses of the third region 30 and the region 30A are 25 nm.

The first configuration CF1 and the second configuration CF2 correspond to configurations of the embodiment. In the first configuration CF1 and the second configuration CF2, the second region 20 that has a larger lattice constant than those of the first region 10 and the third region 30 is provided between the first region 10 and the third region 30. The third configuration CF3 and the fourth configuration CF4 correspond to configurations of the second reference example. In the third configuration CF3 and the fourth configuration CF4, the lattice constant increases in the order of the first region 10, the second region 20, and the third region 30.

In these drawings, the lengths in the lateral direction of the rectangles schematically illustrate the size relationships between the a-axis lattice lengths (lattice constants) of the layers. In these drawings, the value of "a0" is the lattice length (nm).

FIG. 4A to FIG. 4D and FIG. 5A to FIG. 5D are schematic views illustrating characteristics of the semiconductor device.

Figure 4A:
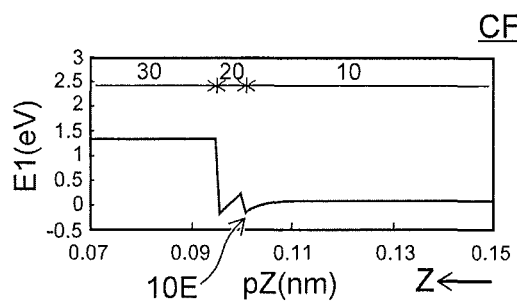
FIG. 4A to FIG. 4D are schematic views illustrating characteristics of the semiconductor device.
Figure 4C:
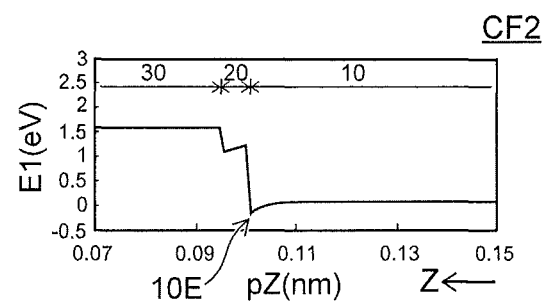
Figure 4B:
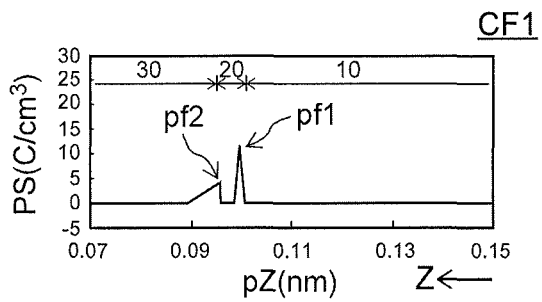
Figure 4D:
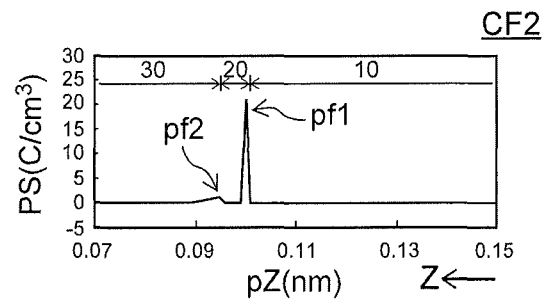
Figure 5A:
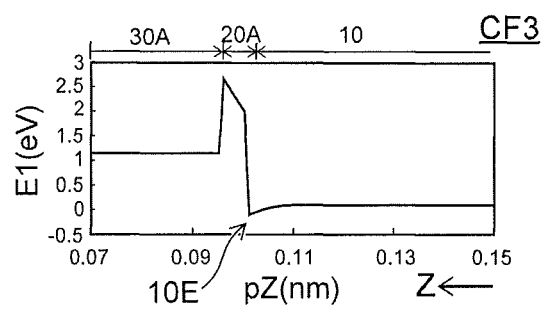
FIG. 5A to FIG. 5D are schematic views illustrating characteristics of the semiconductor device.
Figure 5C:
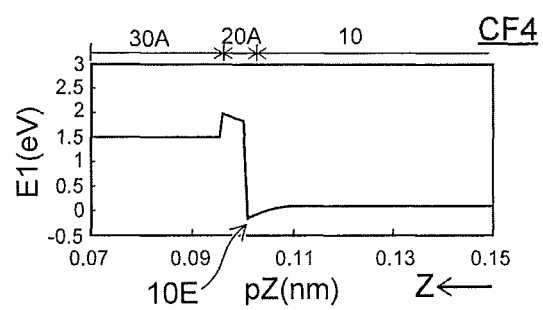
Figure 5B:
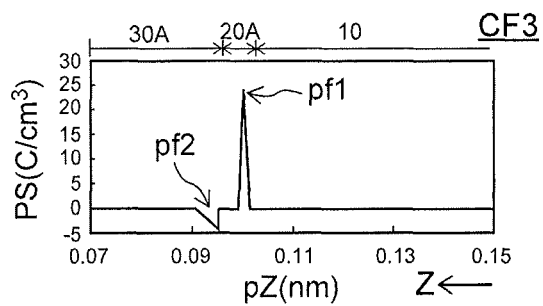
Figure 5D:
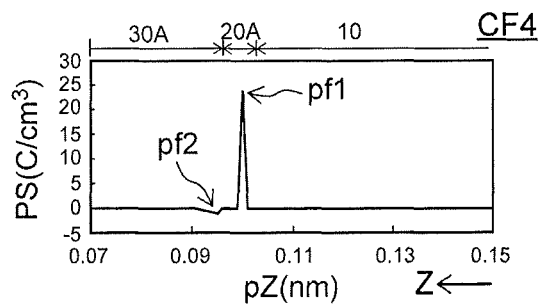

FIG. 4A and FIG. 4B correspond to the first configuration CF1. FIG. 4C and FIG. 4D correspond to the second configuration CF2. FIG. 5A and FIG. 5B correspond to the third configuration CF3. FIG. 5C and FIG. 5D correspond to the fourth configuration CF4. FIG. 4A, FIG. 4C, FIG. 5A, and FIG. 5C show profiles of the conduction band CB. In these figures, the vertical axis is the energy E1 (eV) of the conduction band CB. FIG. 4B, FIG. 4D, FIG. 5B, and FIG. 5D show the profiles of a polarization charge PS. In these figures, the vertical axis is the polarization charge PS (units of $C/cm^3$). The polarization charge PS corresponds to the charge based on spontaneous polarization. In these figures, the horizontal axis is the position pZ (nm) along the Z-axis direction.

As shown in FIG. 4B and FIG. 4D, a polarization charge pf1 is generated at the vicinity of the interface between the first region 10 and the second region 20; and a polarization charge pf2 is generated at the vicinity of the interface between the second region 20 and the third region 30. As shown in FIG. 5B and FIG. 5D, the polarization charge pf1 is generated at the vicinity of the interface between the first region 10 and the region 20A; and the polarization charge pf2 is generated at the vicinity of the interface between the region 20A and the region 30A.

In FIG. 4B and FIG. 4D, the polarity of the polarization charge pf2 is the same as the polarity of the polarization charge pf1. Conversely, in FIG. 5B and FIG. 5D, the polarity of the polarization charge pf2 is the reverse of the polarity of the polarization charge pf1.

Thus, in the first configuration CF1 and the second configuration CF2, the same polarity of the polarization charge PS is generated at the two interfaces. Therefore, the amount of the polarization charge PS of the entirety increases. The amount of the generated two-dimensional electron gas 10E corresponding to the polarization charge PS is high. Conversely, in the third configuration CF3 and the fourth configuration CF4, reverse polarities of the polarization charge PS are generated at the two interfaces. Therefore, the amount of the polarization charge PS of the entirety is low. The amount of the generated two-dimensional electron gas 10E corresponding to the polarization charge PS is low.

Thus, compared to the second reference example (the third configuration CF3 and the fourth configuration CF4), a high-concentration two-dimensional electron gas 10E is obtained in the embodiment (the first configuration CF1 and the second configuration CF2). According to the embodiment, for example, the ON-resistance can be low. According to the embodiment, a semiconductor device can be provided in which the characteristics can be improved.

Figure 6:
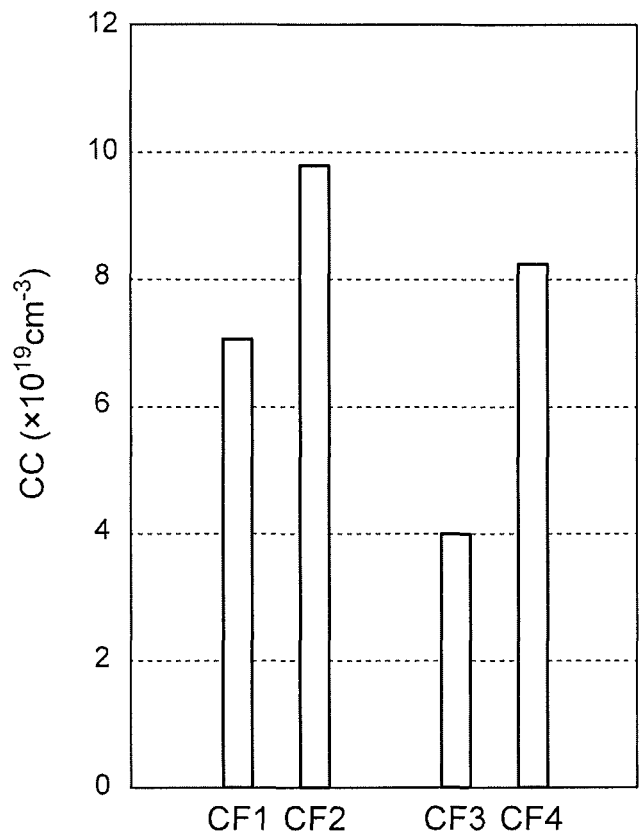
FIG. 6 is a graph illustrating the characteristics of the semiconductor device.

FIG. 6 is a graph illustrating the characteristics of the semiconductor device.

FIG. 6 illustrates a carrier concentration CC ($\times 10^{19}$ $cm^{-3}$) in the first region 10. The carrier concentration CC corresponds to the concentration of the carriers (the two-dimensional electron gas 10E) generated at the portion of the first region 10 opposing the second region 20 (or the region 20A). The horizontal axis of FIG. 6 corresponds to the first to fourth configurations CF1 to CF4. The vertical axis of FIG. 6 is the carrier concentration CC.

As shown in FIG. 6, comparing the first configuration CF1 and the third configuration CF3 of which the composition ratio of Al is the same, the carrier concentration CC of the first configuration CF1 is higher than the carrier concentration CC of the third configuration CF3. Comparing the second configuration CF2 and the fourth configuration CF4 of which the composition ratio of Al is the same, the carrier concentration CC of the second configuration CF2 is higher than the carrier concentration CC of the fourth configuration CF4.

When forming a nitride layer on a SiC layer, the general approach is to form the nitride layer to have a composition such that the difference between the lattice constant of the nitride layer and the lattice constant of the SiC is not large. It is attempted thereby to suppress the lattice mismatch and obtain good crystallinity. Based on such an approach, a configuration would be employed in which nitride layers are formed on the SiC layer so that the lattice constant progressively diverges from the lattice constant of SiC. Therefore, based on a general approach such as that recited above, the third configuration CF3 and the fourth configuration CF4 illustrated in FIG. 3C and FIG. 3D would be employed.

Conversely, in the embodiment, unlike the general approach recited above, the second region 20 which has the lattice constant that is much different from that of SiC is provided on the SiC; and the third region 30 which has the small lattice constant difference is provided on the second region 20. The carrier concentration CC can be higher for such a first configuration CF1 and such a second configuration CF2 than for the third configuration CF3 and the fourth configuration CF4 based on the general approach (referring to FIG. 6). According to the embodiment, a semiconductor device can be provided in which the characteristics can be improved.

In the example recited above, the crystal lattice length is the unstrained lattice length (lattice constant) for each of the first region 10, the second region 20, and the third region 30. It is considered that in the actual crystal, the crystal of the third region 30 is affected by the crystal of the second region 20. For example, it is considered that the lattice length of the first region 10 is the unstrained lattice constant when the first region 10 is thick like a SiC substrate. Relaxation occurs in the second region 20 formed on the first region 10; and the relaxation corresponds to, for example, the formation conditions (the supply rate of the source gas, the temperature of the crystal growth, etc.) of the second region 20, the thickness t2 of the second region 20, etc. It is considered that in such a case, a lattice length that is near the unstrained lattice constant is obtained in the region of the second region 20 on the third region 30 side. It is considered that strain is generated in the crystal lattice of the third region 30 formed on such a second region 20 due to the effects from the second region 20. Examples of the strain of the third region 30 will now be described.

Figure 7:
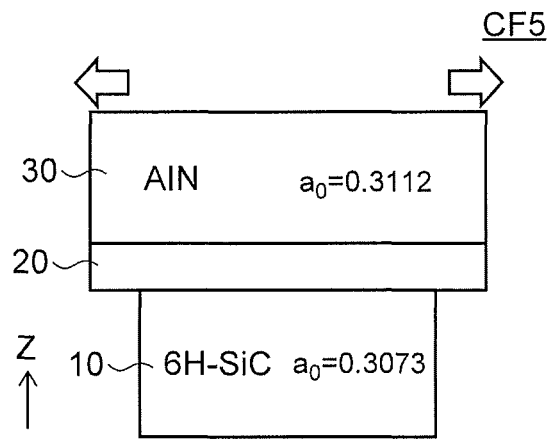
FIG. 7 is a schematic view illustrating the semiconductor device.

FIG. 7 is a schematic view illustrating the semiconductor device.

In a fifth configuration CF5 shown in FIG. 7, relaxation of the second region 20 has occurred. For example, a lattice length that is near the unstrained lattice constant corresponding to the composition x2 of the second region 20 is obtained in the second region 20. Further, in the fifth configuration CF5, the lattices of the third region 30 (e.g., AlN) and the second region 20 are matched. In such a case, tensile stress is applied to the third region 30. The lattice length of the third region 30 is larger than the unstrained lattice constant corresponding to the composition x3 of the third region.

When tensile stress is generated in the third region 30, piezoelectric polarization is generated due to the tensile stress. The orientation of the piezoelectric polarization is the same as the orientation of the spontaneous polarization. Therefore, when the tensile stress is generated in the third region 30, carriers (the two-dimensional electron gas 10E) that correspond to the sum of the spontaneous polarization and the piezoelectric polarization are generated. A higher carrier concentration is obtained. For example, the ON-resistance can be lower.

Figure 8:
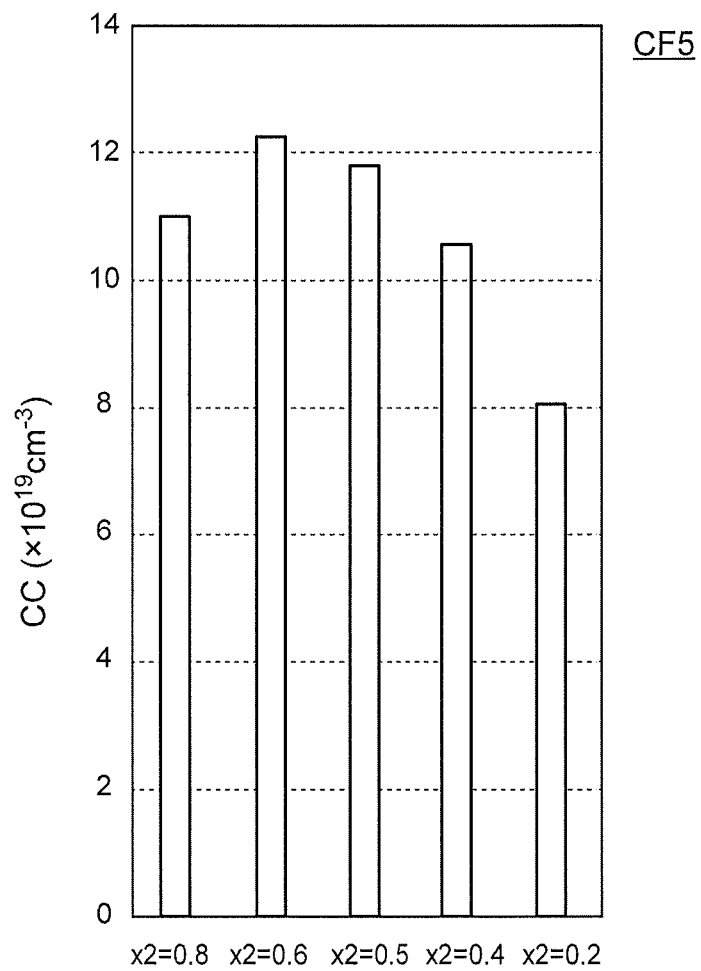
FIG. 8 is a graph illustrating a characteristic of the semiconductor device.

FIG. 8 is a graph illustrating a characteristic of the semiconductor device.

FIG. 8 illustrates the carrier concentration CC ($\times 10^{19}$ cm$^{-3}$) when changing the Al composition ratio x2 of the second region 20 for the fifth configuration CF5 recited above. In FIG. 8, the horizontal axis is the Al composition ratio x2. The vertical axis is the carrier concentration CC. In the example, the first region 10 is a 6H—SiC substrate. The lattice length of the first region 10 is the lattice constant of unstrained 6H—SiC. The second region 20 is relaxed; and the lattice length of the second region 20 is the unstrained lattice constant corresponding to the Al composition ratio x2 of the second region 20. The thickness t2 of the second region 20 is 5 nm. The third region 30 is AlN. The thickness t3 of the third region 30 is 25 nm. A high carrier concentration CC is obtained as shown in FIG. 8.

In the embodiment, for example, the thickness t3 along the first direction (the Z-axis direction) of the third region 30 may be thinner than the thickness t2 along the first direction of the second region 20. Thereby, the third region 30 is affected by the second region 20 easily. The tensile stress is generated easily in the third region 30.

In the embodiment as shown in FIG. 8, a high carrier concentration CC is obtained when the Al composition ratio x2 of the second region 20 is 0.4 or more. A high carrier concentration CC is obtained when the Al composition ratio x2 is 0.5 or more. The Al composition ratio x2 may be not less than 0.5 and not more than 0.8.

On the other hand, the Al composition ratio x3 of the third region 30 is higher than the Al composition ratio x2 of the second region 20. The Al composition ratio x3 of the third region 30 is, for example, 0.85 or more. The Al composition ratio x3 may be, for example, 0.95 or more. The Al composition ratio x3 may be, for example, substantially 1.

In the embodiment, it is more favorable for the first region 10 to include 6H—SiC. The lattice mismatch between the first region 10 and the second region 20 can be suppressed thereby.

In the embodiment, the first region 10 may include 4H—SiC. The first region 10 may include 3C—SiC.

Figure 9:
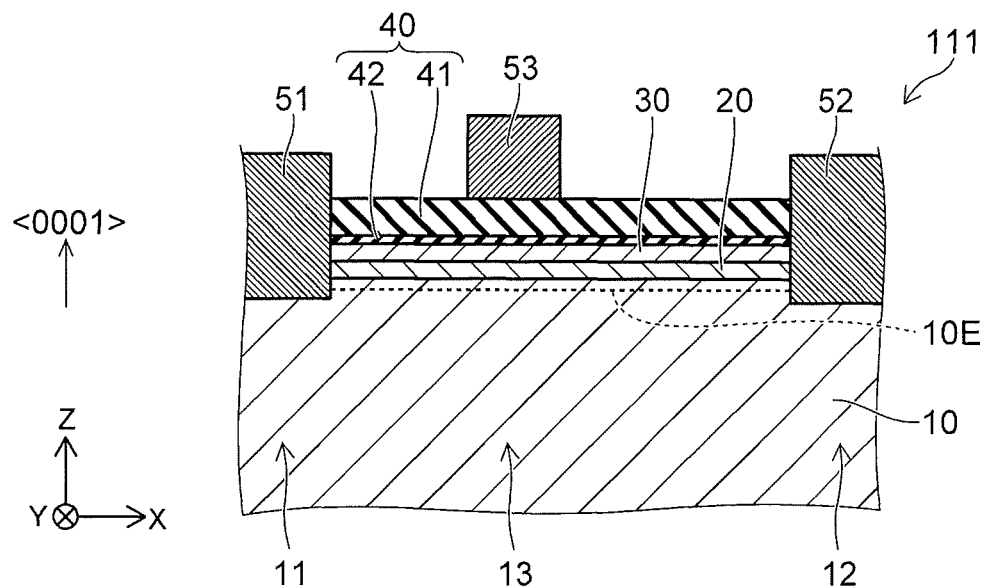
FIG. 9 is a schematic cross-sectional view illustrating a semiconductor device according to the first embodiment.

FIG. 9 is a schematic cross-sectional view illustrating a semiconductor device according to the first embodiment.

In the semiconductor device 111 as shown in FIG. 9, the configurations of the first electrode 51 and the second electrode 52 are different from those of the semiconductor device 110. Otherwise, the configuration of the semiconductor device 111 is the same as the configuration of the semiconductor device 110.

In the semiconductor device 111, at least a portion of the first electrode 51 overlaps the first region 10 in the second direction (e.g., the X-axis direction). At least a portion of the second electrode 52 overlaps the first region 10 in the second direction. At least one of at least a portion of the first electrode 51 or at least a portion of the second electrode 52 may be buried in the first region 10.

Figure 10:
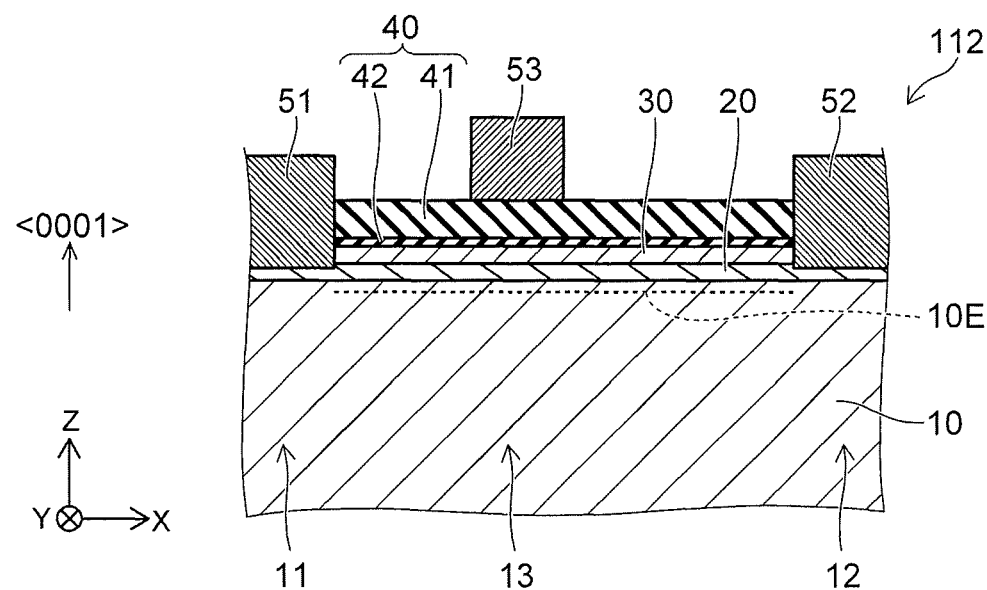
FIG. 10 is a schematic cross-sectional view illustrating a semiconductor device according to the first embodiment.

FIG. 10 is a schematic cross-sectional view illustrating a semiconductor device according to the first embodiment.

In the semiconductor device 112 as shown in FIG. 10, the configurations of the first electrode 51 and the second electrode 52 are different from those of the semiconductor device 110. Otherwise, the configuration of the semiconductor device 112 is the same as the configuration of the semiconductor device 110.

In the semiconductor device 112, a portion of the second region 20 is between the first electrode 51 and the first partial region 11 in the first direction (the Z-axis direction). Another portion of the second region 20 is between the second electrode 52 and the second partial region 12 in the first direction (the Z-axis direction). The first electrode 51 may be provided on the portion of the second region 20. The second electrode 52 may be provided on the other portion of the second region 20.

Figure 11:
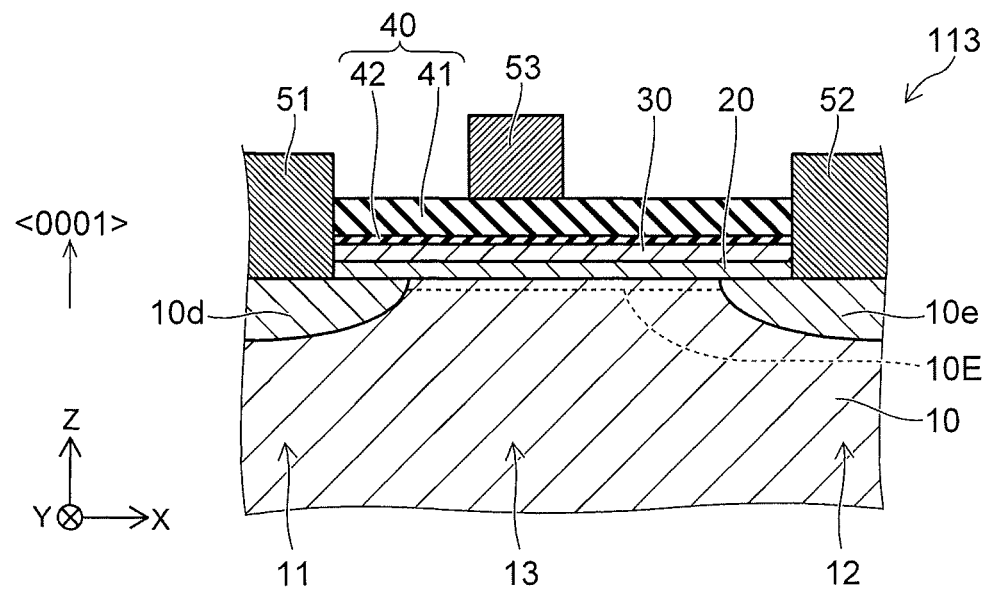
FIG. 11 is a schematic cross-sectional view illustrating a semiconductor device according to the first embodiment.

FIG. 11 is a schematic cross-sectional view illustrating a semiconductor device according to the first embodiment.

As shown in FIG. 11, a fourth region 10d and a fifth region 10e are provided in the semiconductor device 113. Otherwise, the configuration of the semiconductor device 113 is the same as the configuration of the semiconductor device 110.

The fourth region 10d is provided between the first partial region 11 and the first electrode 51. The fifth region 10e is provided between the second partial region 12 and the second electrode 52. The impurity concentration in the fourth region 10d is higher than the impurity concentration in the first partial region 11. The impurity concentration in the fifth region 10e is higher than the impurity concentration in the second partial region 12.

The impurity includes, for example, at least one selected from the group consisting of nitrogen (N) and phosphorus (P). For example, the fourth region 10d and the fifth region 10e are obtained by implanting the element used as the impurity into the region used to form the first region 10.

The fourth region 10d and the fifth region 10e may be provided in the semiconductor devices 111 and 112 recited above.

Second Embodiment

Figure 12:
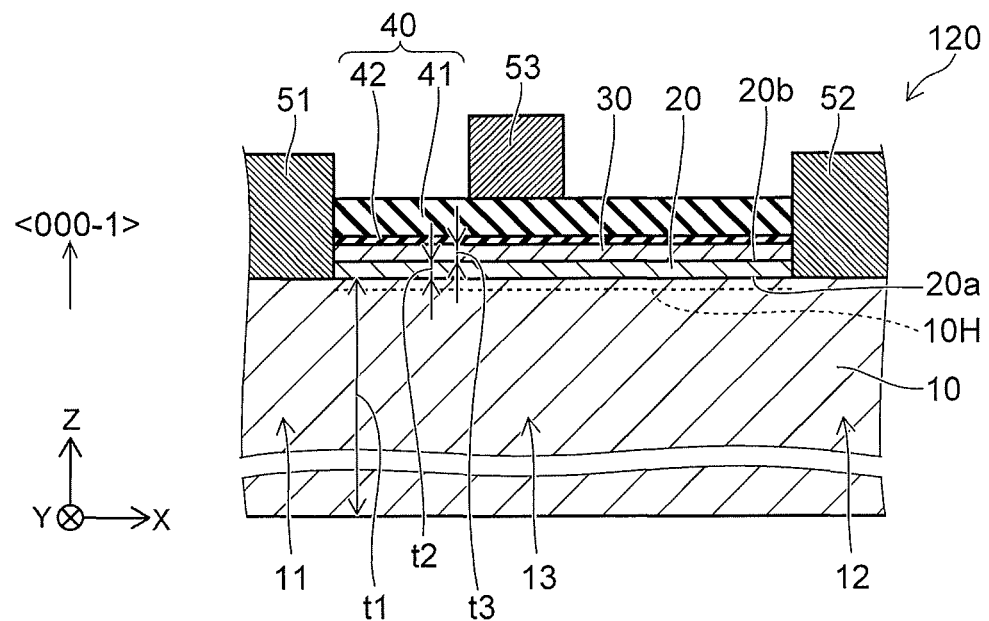
FIG. 12 is a schematic cross-sectional view illustrating a semiconductor device according to a second embodiment.

FIG. 12 is a schematic cross-sectional view illustrating a semiconductor device according to a second embodiment.

As shown in FIG. 12, the semiconductor device 120 according to the second embodiment also includes the first region 10, the second region 20, the third region 30, and the first to third electrodes 51 to 53. The arrangement of these components in the semiconductor device 120 is the same as that of the semiconductor device 110. In the semiconductor device 120, the <000-1> direction has a component in the direction from the first region 10 toward the second region 20.

Hereinbelow, the <000-1> direction of the second region 20 is taken to be aligned with the orientation (the +Z orientation) from the first region 10 toward the second region 20.

Figure 13:
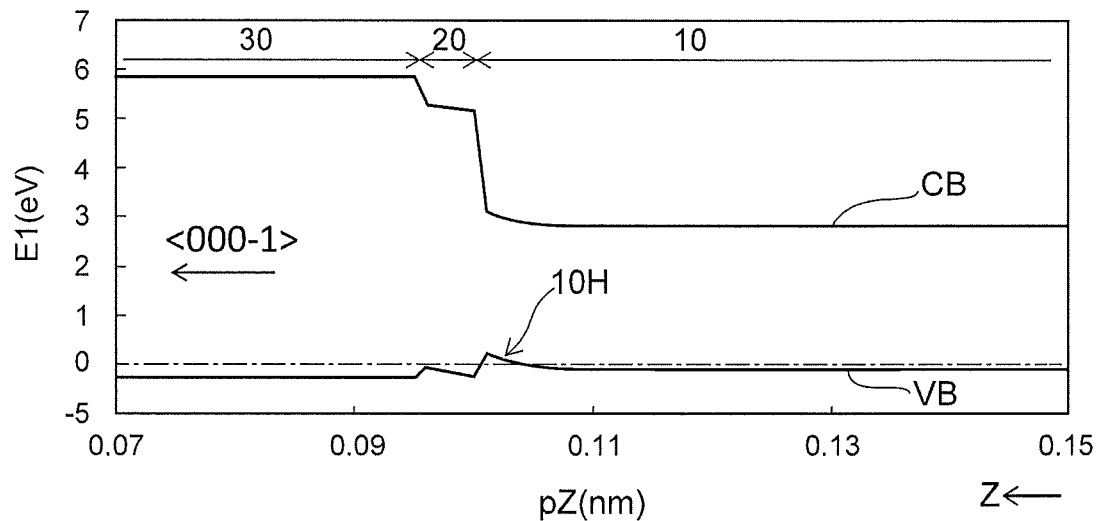
FIG. 13 is a schematic view illustrating characteristics of the semiconductor device according to the second embodiment.

FIG. 13 is a schematic view illustrating characteristics of the semiconductor device according to the second embodiment.

FIG. 13 illustrates simulation results of the characteristics of the semiconductor device 120. In FIG. 13, the horizontal axis is the position pZ (nm) along the Z-axis direction. The vertical axis is the energy E1 (eV). The energies of the conduction band CB and the valence band VB are shown in FIG. 13. In the example, the first region 10 is a 6H—SiC substrate. The second region 20 is $Al_{0.8}Ga_{0.2}N$; and the thickness t2 of the second region 20 is 5 nm. The third region 30 is AlN; and the thickness t3 of the third region 30 is 25 nm.

As shown in FIG. 13, a local peak is observed in the valence band VB at the vicinity of the interface between the first region 10 and the second region 20. The local peak corresponds to a carrier region (e.g., a two-dimensional hole gas 10H).

As described in reference to the first configuration CF1 and the second configuration CF2, compared to the second reference example (the third configuration CF3 and the fourth configuration CF4), a high-concentration two-dimensional hole gas 10H is obtained in the semiconductor device 120 as well. According to the embodiment, for example, the ON-resistance can be low. According to the embodiment, a semiconductor device can be provided in which the characteristics can be improved.

In the second embodiment as well, tensile stress may be generated in the third region 30. Carriers (the two-dimensional hole gas 10H) that correspond to the sum of the spontaneous polarization and the piezoelectric polarization are generated. A higher carrier concentration is obtained. For example, the ON-resistance can be lower.

In the second embodiment as well, a high carrier concentration CC is obtained when the Al composition ratio x2 of the second region 20 is 0.4 or more. A high carrier concentration CC is obtained when the Al composition ratio x2 is 0.5 or more. The Al composition ratio x2 may be not less than 0.5 and not more than 0.8.

In the second embodiment as well, the Al composition ratio x3 of the third region 30 is higher than the Al composition ratio x2 of the second region 20. The Al composition ratio x3 of the third region 30 is, for example, 0.85 or more. The Al composition ratio x3 may be, for example, 0.95 or more. The Al composition ratio x3 may be, for example, substantially 1.

In the second embodiment as well, it is more favorable for the first region 10 to include 6H—SiC. Thereby, lattice mismatch between the first region 10 and the second region 20 can be suppressed.

In the second embodiment as well, the first region 10 may include 4H—SiC. The first region 10 may include 3C—SiC.

Figure 14:
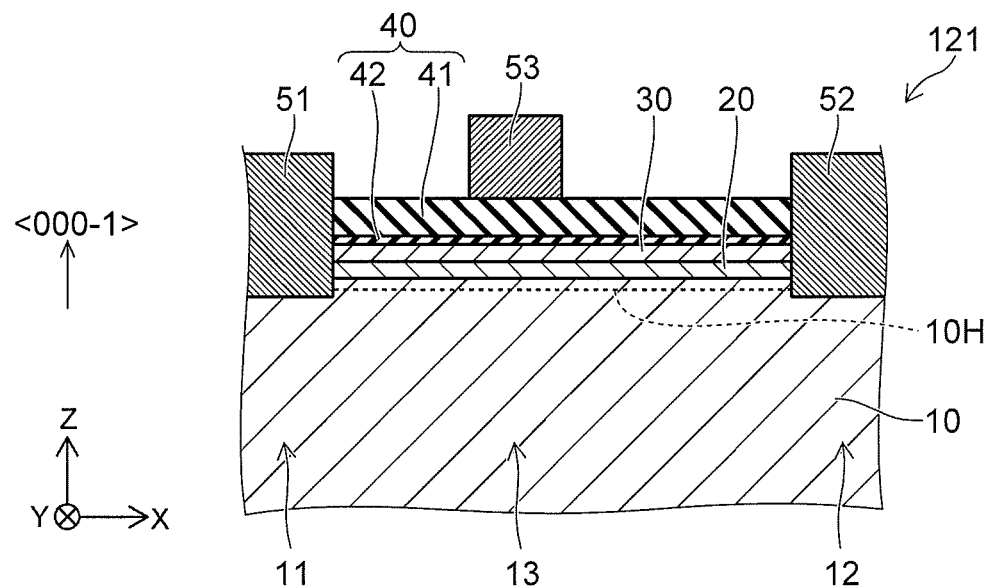
FIG. 14 is a schematic cross-sectional view illustrating a semiconductor device according to the second embodiment.

FIG. 14 is a schematic cross-sectional view illustrating a semiconductor device according to the second embodiment.

In the second embodiment as in the semiconductor device 121 shown in FIG. 14, at least a portion of the first electrode 51 may overlap the first region 10 in the second direction (e.g., the X-axis direction). At least a portion of the second electrode 52 may overlap the first region 10 in the second direction.

Figure 15:
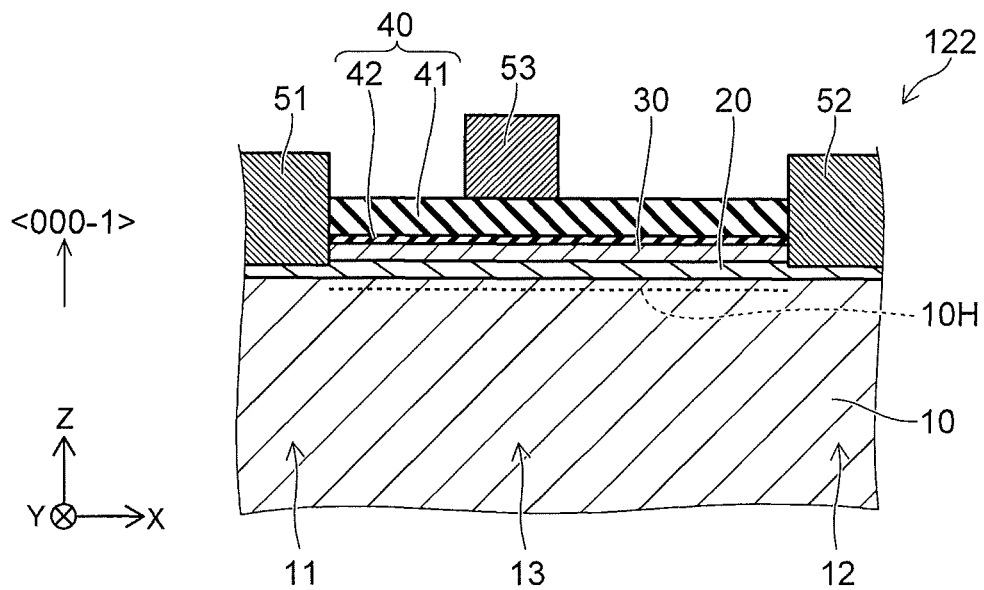
FIG. 15 is a schematic cross-sectional view illustrating a semiconductor device according to the second embodiment.

FIG. 15 is a schematic cross-sectional view illustrating a semiconductor device according to the second embodiment.

As in the semiconductor device 122 shown in FIG. 15, a portion of the second region 20 may be between the first electrode 51 and the first partial region 11 in the first direction (the Z-axis direction). Another portion of the second region 20 may be between the second electrode 52 and the second partial region 12 in the first direction (the Z-axis direction).

Figure 16:
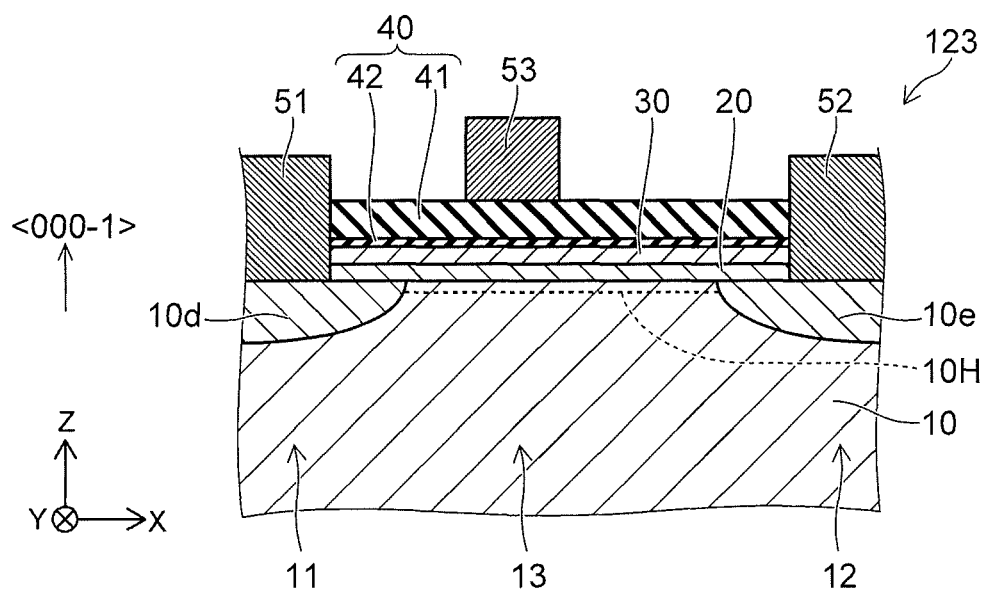
FIG. 16 is a schematic cross-sectional view illustrating a semiconductor device according to the second embodiment.
Figure 17A:
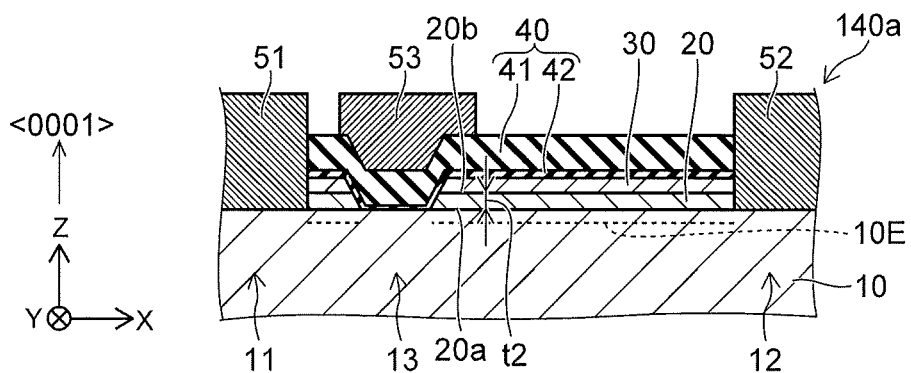
FIG. 17A to FIG. 17D are schematic cross-sectional views illustrating semiconductor devices according to a third embodiment.
Figure 17B:
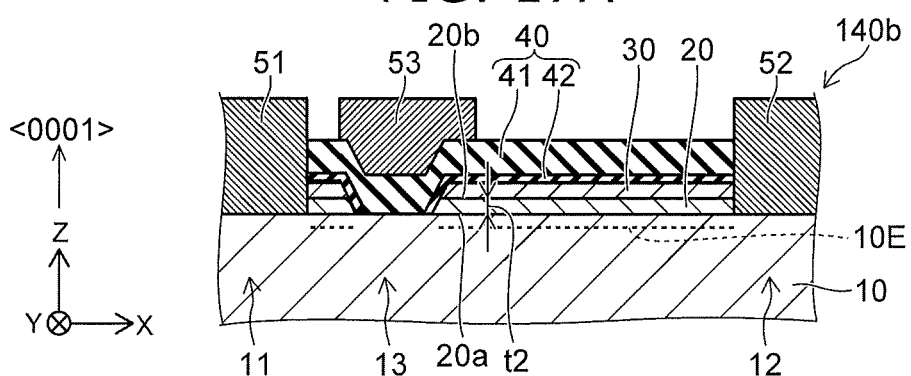
Figure 17C:
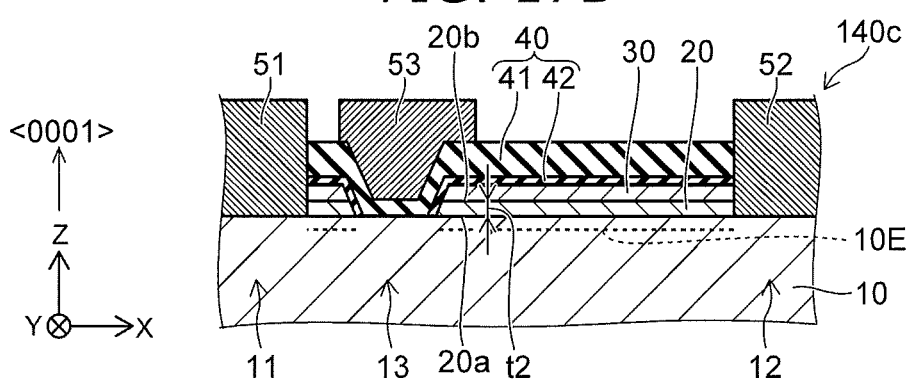
Figure 17D:
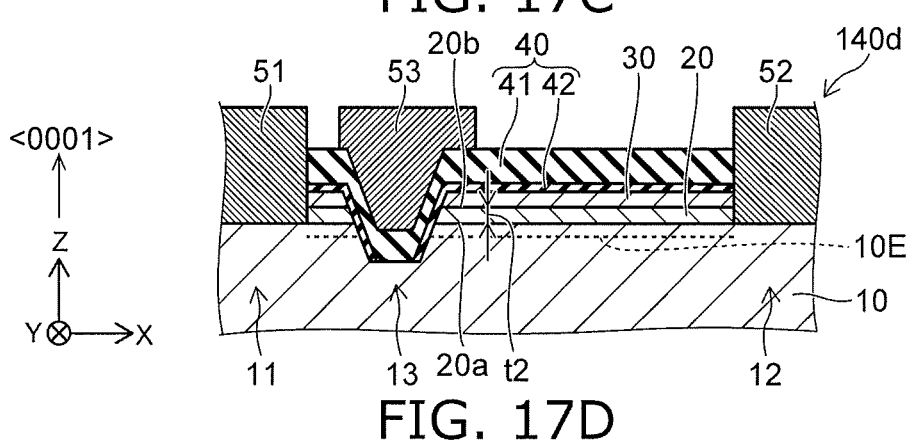
Figure 18A:
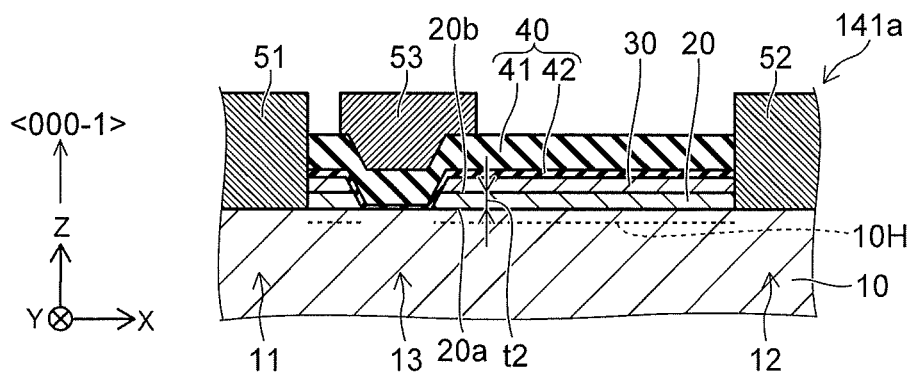
FIG. 18A to FIG. 18D are schematic cross-sectional views illustrating semiconductor devices according to a fourth embodiment.
Figure 18B:
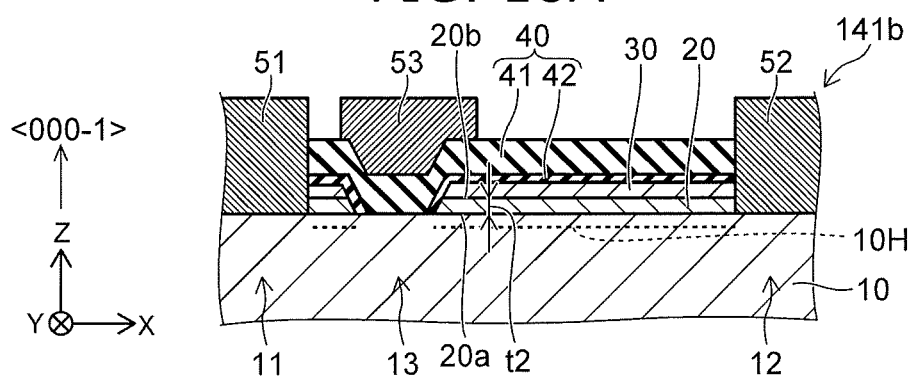
Figure 18C:
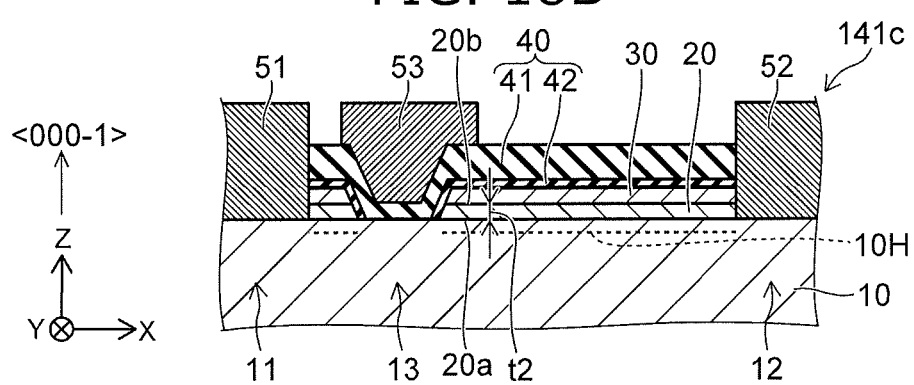
Figure 18D:
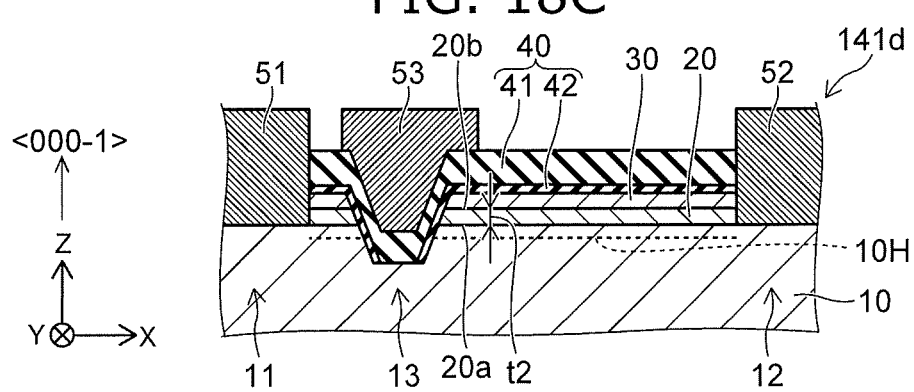

FIG. 16 is a schematic cross-sectional view illustrating a semiconductor device according to the second embodiment.

The fourth region 10d and the fifth region 10e may be provided as in the semiconductor device 123 shown in FIG. 16. The fourth region 10d is provided between the first partial region 11 and the first electrode 51. The fifth region 10e is provided between the second partial region 12 and the second electrode 52. The impurity concentration in the fourth region 10d is higher than the impurity concentration in the first partial region 11. The impurity concentration in the fifth region 10e is higher than the impurity concentration in the second partial region 12.

In the second embodiment, the impurity includes, for example, at least one selected from the group consisting of aluminum (Al) and boron (B). For example, the fourth region 10d and the fifth region 10e are obtained by implanting the element used as the impurity into the region used to form the first region 10.

The fourth region 10d and the fifth region 10e may be provided in the semiconductor devices 121 and 122 recited above.

Third Embodiment

FIG. 17A to FIG. 17D are schematic cross-sectional views illustrating semiconductor devices according to a third embodiment.

As shown in these drawings, semiconductor devices 140a to 140d include the first region 10, the second region 20, the third region 30, the first to third electrodes 51 to 53, and the insulating portion 40. In the semiconductor devices 140a to 140d, the <0001> direction is aligned with the orientation from the first region 10 toward the second region 20. The configurations of the semiconductor devices 140a to 140d other than the description recited below are similar to, for example, the configuration of the semiconductor device 110.

In the semiconductor devices 140a to 140d, a portion of the second region 20 is provided between the third electrode 53 and the first region 10 in the first direction (the Z-axis direction). Another portion of the second region 20 does not overlap the third electrode 53 in the first direction (the Z-axis direction).

For example, a hole (or a recess) is provided in the second region 20; and a portion of the insulating portion 40 is provided in the hole (or the recess).

In the semiconductor devices 140a to 140d, for example, a portion of the insulating portion 40 overlaps the second region 20 in the second direction (e.g., the X-axis direction).

In the semiconductor devices 140c and 140d, at least a portion of the third electrode 53 overlaps the third region 30 in the second direction (e.g., the X-axis direction).

In the semiconductor device 140d, a portion of the insulating portion 40 overlaps the first region 10 in the second direction (e.g., the X-axis direction). In the example of the semiconductor device 140d, at least a portion of the third electrode 53 overlaps the second region 20 in the second direction (the X-axis direction). In the example of the semiconductor device 140d, at least a portion of the third electrode 53 overlaps the first region 10 in the second direction (the X-axis direction).

In the semiconductor devices 140a to 140d, a portion of the first insulating layer 41 is between the third partial region 13 and the third electrode 53 in the first direction (the Z-axis direction).

As in the semiconductor devices 140b to 140d, the portion of the first insulating layer 41 recited above may contact the third partial region 13 in the first direction (the Z-axis direction).

For example, a normally-OFF operation is obtained in the semiconductor devices 140a to 140d.

The carrier region (e.g., the two-dimensional electron gas 10E) that has a high carrier concentration is obtained in the semiconductor devices 140a to 140d.

In the semiconductor device 140a, a portion of the second region 20 (the portion overlapping the third electrode 53) may be thinner than another portion of the second region 20. Even in such a case, for example, a normally-OFF operation is obtained.

Fourth Embodiment

FIG. 18A to FIG. 18D are schematic cross-sectional views illustrating semiconductor devices according to a fourth embodiment.

As shown in these drawings, semiconductor devices 141a to 141d also include the first region 10, the second region 20, the third region 30, the first to third electrodes 51 to 53, and the insulating portion 40. In the semiconductor devices 141a to 141d, the <000-1> direction is aligned with the orientation from the first region 10 toward the second region 20. Otherwise, the configurations of the semiconductor devices 141a to 141d are similar to the configurations of the semiconductor devices 140a to 140d.

In the semiconductor devices 141a to 141d, for example, the carrier region (e.g., the two-dimensional hole gas 10H) that has a high carrier concentration is obtained.

In the third embodiment and the fourth embodiment, at least part of the portion of the second region 20 overlapping the third electrode 53 in the first direction may be 5 nm or less.

In the first to fourth embodiments recited above, the absolute value of the angle between the first direction (the Z-axis direction) and the <0001> direction or the <000-1> direction of the second region 20 is 8 degrees or less. The <0001> direction or the <000-1> direction may be parallel to the first direction (the Z-axis direction). The <0001> direction or the <000-1> direction may be tilted from the first direction at an angle of 8 degrees or less. For example, the absolute value of the angle between the first surface 20a of the second region 20 on the first region 10 side (referring to FIG. 1, etc.) and the <0001> direction or the <000-1> direction of the second region 20 is not less than 82 degrees and not more than 98 degrees. By such an angle, the carriers that are due to the spontaneous polarization of the crystal of the second region 20 are generated efficiently in the first region 10. The carriers that correspond to the piezoelectric polarization due to the stress are generated efficiently in the first region 10.

For example, at least one of the second region 20 or the third region 30 is formed by at least one selected from the group consisting of MOCVD (metal-organic chemical vapor deposition), molecular beam epitaxy (MBE), hydride vapor phase epitaxy (HVPE), sputtering, and pulsed laser deposition.

According to the embodiments, by providing the first region 10, for example, a transistor is obtained in which the breakdown voltage performance is superior, the heat dissipation is superior, and the ON-resistance is lower than those of a GaN-based HEMT. The two-dimensional hole gas that can be formed is not easily formed in a GaN-based HEMT.

The embodiments may include the following configurations (e.g., technological proposals).

Configuration 1

A semiconductor device, comprising:
- a first region including SiC and including a first partial region, a second partial region, and a third partial region between the first partial region and the second partial region;
- a first electrode, a direction from the first partial region toward the first electrode being aligned with a first direction;
- a second electrode, a direction from the second partial region toward the second electrode being aligned with the first direction, a second direction from the first electrode toward the second electrode crossing the first direction;
- a third electrode, a direction from the third partial region toward the third electrode being aligned with the first direction, a position of the third electrode in the second direction being between a position of the first electrode in the second direction and a position of the second electrode in the second direction;
- a second region including $Al_{x2}Ga_{1-x2}N$ (0.2≤x2<1); and
- a third region including $Al_{x3}Ga_{1-x3}N$ (x2<x3≤1), at least a portion of the third region being provided between the first electrode and the second electrode in the second direction, at least a portion of the second region being provided between the third region and the first region.

Configuration 2

The semiconductor device according to Configuration 1, further comprising an insulating portion,
at least a portion of the third region being provided between the insulating portion and the second region in the first direction.

Configuration 3

The semiconductor device according to Configuration 2, wherein at least a portion of the insulating portion is provided between the third electrode and the third region in the first direction.

Configuration 4

The semiconductor device according to Configuration 3, wherein
the insulating portion includes a first insulating layer and a second insulating layer,
the second insulating layer is provided between the first insulating layer and the third region in the first direction,
the first insulating layer includes oxygen,
the second insulating layer includes nitrogen,
the second insulating layer does not include oxygen, or a concentration of oxygen in the second insulating layer is lower than a concentration of oxygen in the first insulating layer.

Configuration 5

The semiconductor device according to Configuration 4, wherein
a portion of the first insulating layer is between the third partial region and the third electrode in the first direction, and
the portion of the first insulating layer contacts the third partial region in the first direction.

Configuration 6

The semiconductor device according to any one of Configurations 1 to 5, wherein a portion of the insulating portion overlaps the second region in the second direction.

Configuration 7

The semiconductor device according to any one of Configurations 1 to 6, wherein a portion of the insulating portion overlaps the first region in the second direction.

Configuration 8

The semiconductor device according to any one of Configurations 1 to 7, wherein at least a portion of the third electrode overlaps the second region in the second direction.

Configuration 9

The semiconductor device according to any one of Configurations 1 to 8, wherein
the first electrode is electrically connected to the first partial region, and
the second electrode is electrically connected to the second partial region.

Configuration 10

The semiconductor device according to any one of Configurations 1 to 9, wherein
at least a portion of the first electrode overlaps the first region in the second direction, and
at least a portion of the second electrode overlaps the first region in the second direction.

Configuration 11

The semiconductor device according to any one of Configurations 1 to 9, wherein
a portion of the second region is between the first electrode and the first partial region, and
another portion of the second region is between the second electrode and the second partial region.

Configuration 12

The semiconductor device according to any one of Configurations 1 to 11, further comprising:
a fourth region provided between the first partial region and the first electrode; and
a fifth region provided between the second partial region and the second electrode,
an impurity concentration in the fourth region being higher than an impurity concentration in the first partial region,
an impurity concentration in the fifth region being higher than an impurity concentration in the second partial region.

Configuration 13

The semiconductor device according to any one of Configurations 1 to 12, wherein the first region includes 6H—SiC.

Configuration 14

The semiconductor device according to any one of Configurations 1 to 13, wherein
x2 is 0.5 or more, and
x3 is 0.85 or more.

Configuration 15

The semiconductor device according to any one of Configurations 1 to 14, wherein a thickness along the first direction of the second region is not less than 2 nm and not more than 100 nm.

Configuration 16

The semiconductor device according to any one of Configurations 1 to 15, wherein a thickness along the first direction of the third region is thicker than a thickness along the first direction of the second region.

Configuration 17

The semiconductor device according to any one of Configurations 1 to 15, wherein a thickness along the first direction of the third region is thinner than a thickness along the first direction of the second region.

Configuration 18

The semiconductor device according to any one of Configurations 1 to 17, wherein at least a portion of the second region is provided between the first region and at least a portion of the third electrode.

Configuration 19

The semiconductor device according to any one of Configurations 1 to 18, wherein an absolute value of an angle between the first direction and a <0001> direction or a <000-1> direction of the second region is 8 degrees or less.

Configuration 20

The semiconductor device according to any one of Configurations 1 to 18, wherein an absolute value of an angle between a first surface of the second region and a <0001> direction or a <000-1> direction of the second region is not less than 82 degrees and not more than 98 degrees, the first surface being on the first region side of the second region.

According to the embodiments, a semiconductor device can be provided in which the characteristics can be improved.

In the specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first region including SiC and including a first partial region, a second partial region, and a third partial region between the first partial region and the second partial region;
    a first electrode, a direction from the first partial region toward the first electrode being aligned with a first direction;
    a second electrode, a direction from the second partial region toward the second electrode being aligned with the first direction, a second direction from the first electrode toward the second electrode crossing the first direction;
    a third electrode, a direction from the third partial region toward the third electrode being aligned with the first direction, a position of the third electrode in the second direction being between a position of the first electrode in the second direction and a position of the second electrode in the second direction;
    a second region including $Al_{x2}Ga_{1-x2}N$ ($0.2 \leq x2 < 1$); and
    a third region including $Al_{x3}Ga_{1-x3}N$ ($x2 < x3 \leq 1$), at least a portion of the third region being provided between the first electrode and the second electrode in the second direction, at least a portion of the second region being provided between the third region and the first region.

2. The semiconductor device according to claim 1, further comprising an insulating portion,
    at least a portion of the third region being provided between the insulating portion and the second region in the first direction.

3. The semiconductor device according to claim 2, wherein at least a portion of the insulating portion is provided between the third electrode and the third region in the first direction.

4. The semiconductor device according to claim 3, wherein
    the insulating portion includes a first insulating layer and a second insulating layer,
    the second insulating layer is provided between the first insulating layer and the third region in the first direction,
    the first insulating layer includes oxygen,
    the second insulating layer includes nitrogen,
    the second insulating layer does not include oxygen, or a concentration of oxygen in the second insulating layer is lower than a concentration of oxygen in the first insulating layer.

5. The semiconductor device according to claim 4, wherein
    a portion of the first insulating layer is between the third partial region and the third electrode in the first direction, and
    the portion of the first insulating layer contacts the third partial region in the first direction.

6. The semiconductor device according to claim 2, wherein a portion of the insulating portion overlaps the second region in the second direction.

7. The semiconductor device according to claim 2, wherein a portion of the insulating portion overlaps the first region in the second direction.

8. The semiconductor device according to claim 1, wherein at least a portion of the third electrode overlaps the second region in the second direction.

9. The semiconductor device according to claim 1, wherein
    the first electrode is electrically connected to the first partial region, and
    the second electrode is electrically connected to the second partial region.

10. The semiconductor device according to claim 1, wherein
    at least a portion of the first electrode overlaps the first region in the second direction, and
    at least a portion of the second electrode overlaps the first region in the second direction.

11. The semiconductor device according to claim 1, wherein
    a portion of the second region is between the first electrode and the first partial region, and
    another portion of the second region is between the second electrode and the second partial region.

12. The semiconductor device according to claim 1, further comprising:
    a fourth region provided between the first partial region and the first electrode; and
    a fifth region provided between the second partial region and the second electrode,
    an impurity concentration in the fourth region being higher than an impurity concentration in the first partial region,
    an impurity concentration in the fifth region being higher than an impurity concentration in the second partial region.

13. The semiconductor device according to claim 1, wherein the first region includes 6H—SiC.

14. The semiconductor device according to claim 1, wherein
x2 is 0.5 or more, and
x3 is 0.85 or more.

15. The semiconductor device according to claim 1, wherein a thickness along the first direction of the second region is not less than 2 nm and not more than 100 nm.

16. The semiconductor device according to claim 1, wherein a thickness along the first direction of the third region is thicker than a thickness along the first direction of the second region.

17. The semiconductor device according to claim 1, wherein a thickness along the first direction of the third region is thinner than a thickness along the first direction of the second region.

18. The semiconductor device according to claim 1, wherein at least a portion of the second region is provided between the first region and at least a portion of the third electrode.

19. The semiconductor device according to claim 1, wherein an absolute value of an angle between the first direction and a <0001> direction or a <000-1> direction of the second region is 8 degrees or less.

20. The semiconductor device according to claim 1, wherein an absolute value of an angle between a first surface of the second region and a <0001> direction or a <000-1> direction of the second region is not less than 82 degrees and not more than 98 degrees, the first surface being on the first region side of the second region.

* * * * *